(12) United States Patent
Kim et al.

(10) Patent No.: US 11,456,436 B2
(45) Date of Patent: Sep. 27, 2022

(54) DISPLAY DEVICE

(71) Applicant: Samsung Display Co., Ltd., Yongin-Si (KR)

(72) Inventors: Tae-Chang Kim, Anyang-si (KR); Minseop Kim, Cheonan-si (KR); Changmin Park, Gwangmyeong-si (KR); Sungwoo Cho, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 23 days.

(21) Appl. No.: 17/086,571

(22) Filed: Nov. 2, 2020

(65) Prior Publication Data
US 2021/0249625 A1    Aug. 12, 2021

(30) Foreign Application Priority Data

Feb. 10, 2020 (KR) .......................... 10-2020-0015369

(51) Int. Cl.
*G06F 1/16* (2006.01)
*H01L 51/52* (2006.01)

(52) U.S. Cl.
CPC ........ *H01L 51/5237* (2013.01); *G06F 1/1641* (2013.01); *G06F 1/1652* (2013.01); *H01L 2251/5338* (2013.01)

(58) Field of Classification Search
CPC .... G06F 1/1643; G06F 1/1681; G06F 1/1652; H04M 1/0214
See application file for complete search history.

(56) References Cited

U.S. PATENT DOCUMENTS

| | | | |
|---|---|---|---|
| 10,398,048 B2 | 8/2019 | Jeon | |
| 10,930,883 B2* | 2/2021 | Park | G06F 1/1652 |
| 2016/0357052 A1* | 12/2016 | Kim | H01L 51/5237 |
| 2017/0066057 A1* | 3/2017 | Manuel | C25D 1/00 |
| 2017/0153668 A1* | 6/2017 | Jang | G06F 1/1641 |
| 2018/0343756 A1* | 11/2018 | Lin | G02F 1/16753 |
| 2019/0305238 A1* | 10/2019 | Shin | H01L 27/3244 |
| 2020/0019212 A1* | 1/2020 | Jung | G06F 1/1652 |
| 2020/0022267 A1* | 1/2020 | Han | B32B 27/302 |
| 2020/0144553 A1* | 5/2020 | Ogasawara | B32B 15/085 |
| 2020/0209998 A1* | 7/2020 | Shin | G06F 3/044 |

(Continued)

FOREIGN PATENT DOCUMENTS

| | | |
|---|---|---|
| KR | 10-2019-0037585 | 4/2019 |
| KR | 10-2019-0043826 | 4/2019 |

*Primary Examiner* — Abhishek M Rathod
(74) *Attorney, Agent, or Firm* — F. Chau & Associates, LLC

(57) ABSTRACT

A display device may include a first non-folding region, a second non-folding region, and a folding region. The display device may include a display member including a display module, a supporting member supporting the display member, an adhesion member disposed between the display member and the supporting member, and a compensation member attached to one of top and bottom surfaces of the adhesion member and overlapped with the folding region. Thus, it may be possible to provide a display device configured to reduce a stress, which is exerted on a folding region when it is in a folded state, and to prevent the folding region from being deformed to a bent shape when it is in an unfolded state.

20 Claims, 14 Drawing Sheets

(56) References Cited

U.S. PATENT DOCUMENTS

| | | | |
|---|---|---|---|
| 2020/0260596 A1* | 8/2020 | Park | H01L 51/5246 |
| 2020/0260603 A1* | 8/2020 | Choi | H05K 5/03 |
| 2020/0273381 A1* | 8/2020 | Shin | G06F 1/1652 |

* cited by examiner

DISPLAY DEVICE

CROSS-REFERENCE TO RELATED APPLICATION

This U.S. non-provisional patent application claims priority under 35 U.S.C. § 119 to Korean Patent Application No. 10-2020-0015369, filed on Feb. 10, 2020, in the Korean Intellectual Property Office, the disclosure of which is incorporated by reference herein in its entirety.

TECHNICAL FIELD

The present disclosure relates to a display device, and in particular, to a display device including a folding region.

DISCUSSION OF THE RELATED ART

A display device displays various images, which provide information to a user, on its display screen. In general, the display device displays information within a given display screen. Flexible display devices, which include a flexible display panel configured to fold, are currently under development. Unlike a rigid display device, the flexible display device can be folded, rolled, or bent. Due to the flexible display device's changeable shape, the flexible display device can be portably carried by the user, without having to limit the screen size of the display device, and thus, it is possible to increase the user's convenience.

SUMMARY

According to an example embodiment of the present disclosure, a display device including: a first non-folding region, a second non-folding region, and a folding region; a display member including a display module; a supporting layer disposed on the display member; an adhesion layer disposed between the display member and the supporting layer; and a compensation layer attached to the adhesion layer and overlapped with the folding region.

In an example embodiment of the present disclosure, the supporting layer includes a first supporting layer and a second supporting layer spaced apart from the first supporting layer in the folding region, wherein the adhesion layer includes a first adhesion layer and a second adhesion layer, wherein the first adhesion layer is adhered to the first supporting layer, and the second adhesion layer is adhered to the second supporting layer, and wherein the compensation layer includes a first compensation layer and a second compensation layer, wherein the first compensation layer is attached to the first adhesion layer, and the second compensation layer is attached to the second adhesion layer.

In an example embodiment of the present disclosure, the first compensation layer and the second compensation layer have a same width as each other, and wherein, in the folding region, the width of the first compensation layer and the width of the second compensation layer are substantially equal to a width of the first adhesion layer and a width of the second adhesion layer, respectively.

In an example embodiment of the present disclosure, the display device further includes a cushion layer disposed below the supporting layer, wherein the cushion layer includes a first cushion layer and a second cushion layer, wherein the first cushion layer overlaps the first supporting layer, and the second cushion layer overlaps the second supporting layer.

In an example embodiment of the present disclosure, the display member has a first state and a second state, wherein, in the first state, the display member is configured to be flat, and in the second state, the folding region is bent such that the first non-folding region faces the second non-folding region.

In an example embodiment of the present disclosure, in the first state, the compensation layer is in contact with a bottom surface of the display member in the folding region.

In an example embodiment of the present disclosure, in the second state, the first compensation layer and the second compensation layer face each other and are not in contact with at least a portion of a bottom surface of the display member.

In an example embodiment of the present disclosure, wherein the compensation layer is not overlapped with the first non-folding region and the second non-folding region.

In an example embodiment of the present disclosure, a thickness of the compensation layer is smaller than a thickness of the adhesion layer.

In an example embodiment of the present disclosure, a thickness of the compensation layer ranges from about 3 μm to about 5 μm.

In an example embodiment of the present disclosure, wherein the compensation layer includes a metal layer.

In an example embodiment of the present disclosure, wherein the metal layer includes an aluminum and/or silver layer.

In an example embodiment of the present disclosure, wherein the supporting layer includes a lattice region including a plurality of openings formed therein, and wherein the lattice region is overlapped with the folding region.

In an example embodiment of the present disclosure, the display device further includes: a cushion layer disposed below the supporting layer; and a supporting plate disposed below the cushion layer, wherein the supporting plate includes a first supporting plate and a second supporting plate spaced apart from each other in the folding region.

In an example embodiment of the present disclosure, the compensation layer is attached to a bottom surface of the adhesion layer, and wherein the supporting layer includes a first supporting layer and a second supporting layer spaced apart from each other in the folding region.

In an example embodiment of the present disclosure, the adhesion layer includes a first adhesion layer and a second adhesion layer, wherein the first adhesion layer is adhered to the first supporting layer, and the second adhesion layer is adhered to the second supporting layer, and wherein the compensation layer includes a first compensation layer and a second compensation layer, wherein the first compensation layer is attached to the first adhesion layer, and the second compensation layer is attached to the second adhesion layer.

In an example embodiment of the present disclosure, the display member has a first state and a second state, wherein, in the first state, the display member is configured to be flat, and in the second state, the folding region is bent such that the first non-folding region faces the second non-folding region.

In an example embodiment of the present disclosure, in the first state, the compensation layer is in contact with a top surface of the supporting layer in the folding region.

In an example embodiment of the present disclosure, in the second state, the compensation layer is bent along with the display member and is not in contact with at least a portion of a top surface of the supporting layer.

According to an example embodiment of the present disclosure, a display device, includes: a display member including a first non-folding region, a second non-folding region, a folding region and a display module, wherein the display module has a first state and/or a second state, wherein, in the first state, the display member is configured to be flat, and in the second state, the folding region is bent; a supporting layer including a first supporting layer and a second supporting layer spaced apart from each other in a region corresponding to the folding region; an adhesion layer including a first adhesion layer and a second adhesion layer, wherein the first adhesion layer is disposed between the display member and the first supporting layer, and the second adhesion layer is disposed between the display member and the second supporting layer; and a compensation layer including a first compensation layer and a second compensation layer, wherein the first compensation layer is attached to the first adhesion layer, and the second compensation layer is attached to the second adhesion layer, wherein each of the first and second compensation layers is overlapped with the folding region and is not overlapped with the first and second non-folding regions, and wherein, in the second state, the first compensation layer and the second compensation layer are not in contact with a top surface of the display member and face each other.

BRIEF DESCRIPTION OF THE DRAWINGS

The above and other features of the present disclosure will become more apparent by describing in detail example embodiments thereof, with reference to the accompanying drawings, in which.

DETAILED DESCRIPTION OF THE EMBODIMENTS

Figure 1A:
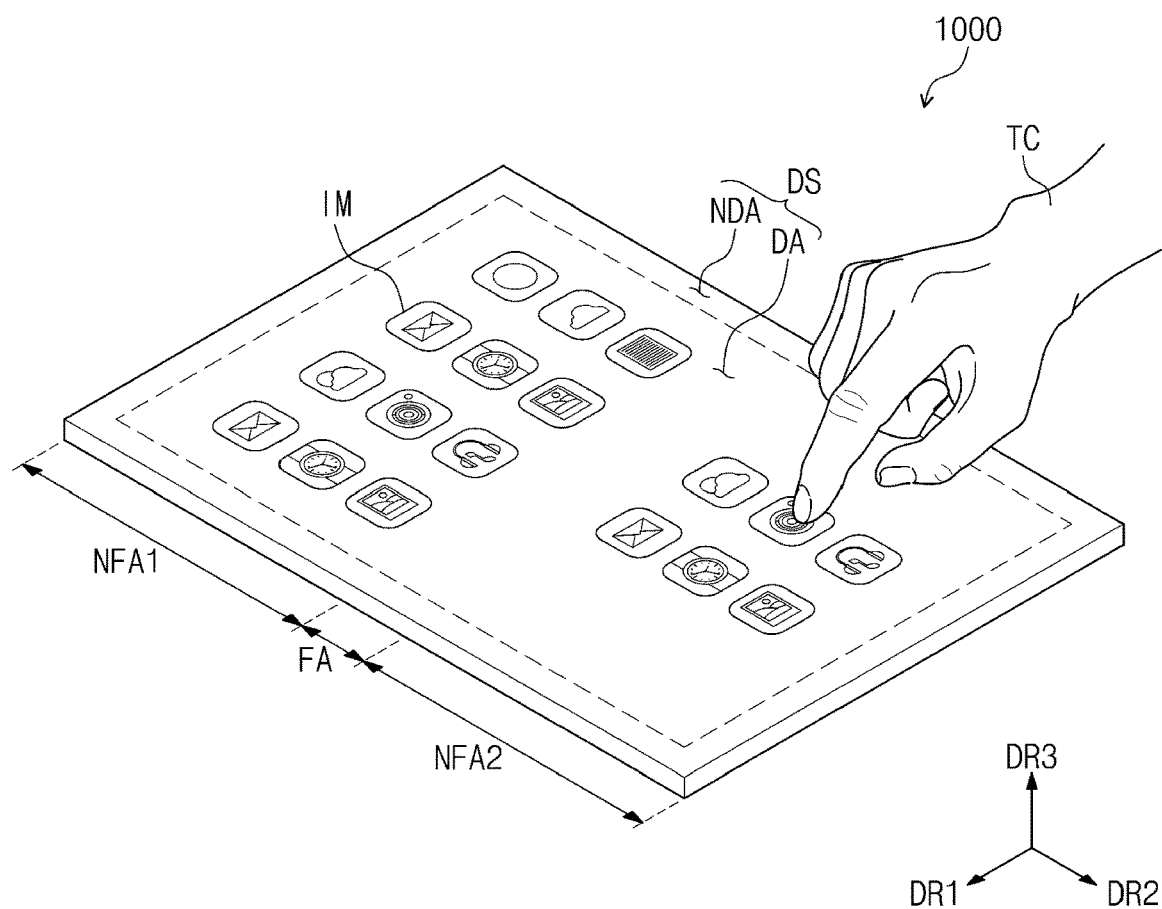
FIG. 1A is a perspective view illustrating a display device according to an example embodiment of the present disclosure.

Example embodiments of the present disclosure will now be described more fully with reference to the accompanying drawings, in which example embodiments are shown. Example embodiments of the present disclosure may, however, be embodied in many different forms and should not be construed as being limited to the embodiments set forth herein. In the drawings, the thicknesses of layers and regions may be exaggerated for clarity. Like reference numerals in the drawings may denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section and vice versa without departing from the spirit and scope of the present disclosure.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, in the example, the term "below" can encompass both an orientation of above and below. The device may be otherwise oriented (e.g., rotated 90 degrees or at other orientations) and the spatially relative descriptors used herein may be interpreted accordingly.

The terminology used herein is for the purpose of describing example embodiments of the present disclosure only and is not intended to be limiting of example embodiments. As used herein, the singular forms "a," "an" and "the" are intended to include the plural forms as well, unless the context clearly indicates otherwise.

Example embodiments of the present disclosure are described herein with reference to cross-sectional illustrations that are schematic illustrations of example embodiments of the present disclosure (and, e.g., intermediate structures). As such, variations from the shapes of the illustrations as a result of, for example, manufacturing techniques and/or tolerances, are to be expected. Thus, example embodiments of the present disclosure should not be construed as limited to the particular shapes of regions illustrated herein but are to include deviations in shapes that result, for example, from manufacturing.

Figure 1B:
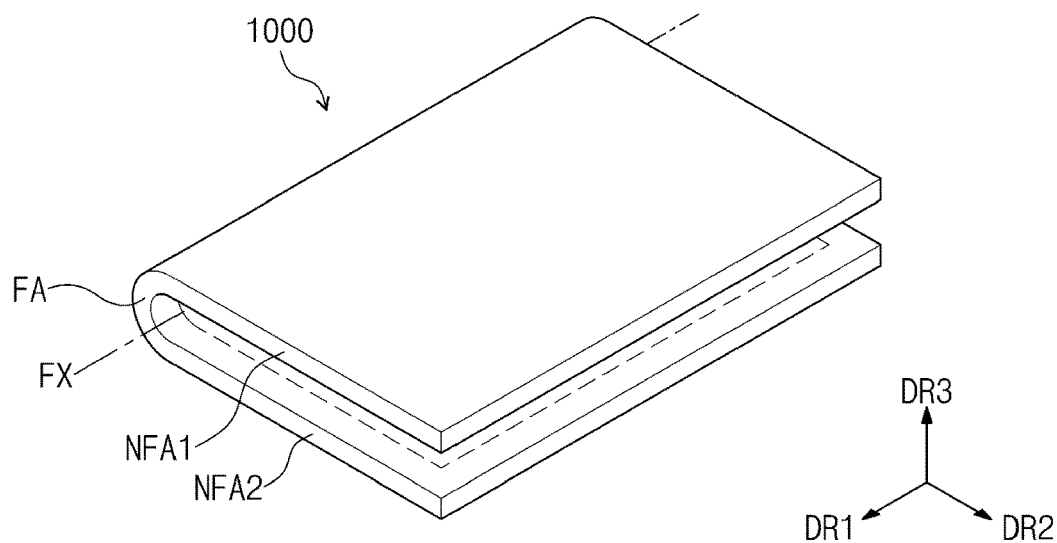
FIG. 1B is a perspective view illustrating a folded state of the display device of FIG. 1A.

FIG. 1A is a perspective view illustrating a display device according to an example embodiment of the present disclosure. FIG. 1B is a perspective view illustrating a folded state of the display device of FIG. 1A.

Referring to FIGS. 1A and 1B, a display device 1000 may be a foldable display device. In an example embodiment of the present disclosure, the display device 1000 may be used for relatively large-sized electronic devices (e.g., television sets and monitors) or relatively small- or medium-sized electronic devices (e.g., mobile phones, tablets, car navigation systems, game machines, and smart watches).

A top surface of the display device 1000 may be a display surface DS, and when it is in an unfolded state, the display surface DS may have a planar surface parallel to a first direction DR1 and a second direction DR2.

The display surface DS may include a display region DA and a non-display region NDA near the display region DA. The display region DA may be a region, on which an image IM is displayed, and the non-display region NDA may be a region, which is not used to display the image IM. FIG. 1A illustrates application icons as an example of the image IM.

The display region DA may have a polygonal shape. For example, the display region DA may have a rectangular or square shape. The non-display region NDA may at least partially surround the display region DA. For example, the non-display region NDA may enclose the display region DA. However, the present disclosure is not limited thereto, and the shapes of the display and non-display regions DA and NDA may be variously changed in a mutually influential manner.

The display device 1000 may include a first non-folding region NFA1, a folding region FA, and a second non-folding region NFA2, which are sequentially provided in a second direction DR2. In other words, the folding region FA may be provided between the first non-folding region NFA1 and the second non-folding region NFA2, FIGS. 1A and 1B illustrate, as an example, one folding region FA and two non-folding regions (e.g., the first and second non-folding regions NFA1 and NFA2), but the numbers of the folding region FA and the first and second non-folding regions NFA1 and NFA2 are not limited thereto. For example, the display device 1000 may include two or more non-folding regions and folding regions disposed between the non-folding regions.

The display device 1000 may be folded along a folding axis FX. In other words, the folding region FA may be bent along the folding axis FX. The folding axis FX may be extended in a first direction DR1. The folding axis FX may be a short axis that is parallel to the short side of the display device 1000.

If the display device 1000 is folded, the display surface of the first non-folding region NFA1 may face the display surface of the second non-folding region NFA2. Thus, when the display device 1000 is in the folded state, the display surface DS may not be exposed to the outside. However, the present disclosure is not limited thereto. In an example embodiment of the present disclosure, when the display device 1000 is in the folded state, the display surface of the first non-folding region NFA1 and the display surface of the second non-folding region NFA2 may be exposed to the outside. For example, in the folded state, the display surface of the first non-folding region NFA1 may face away from the display surface of the second non-folding region NFA2. Thus, when the display device 1000 is in the folded state, the display surface DS may be exposed to the outside.

Figure 2A:
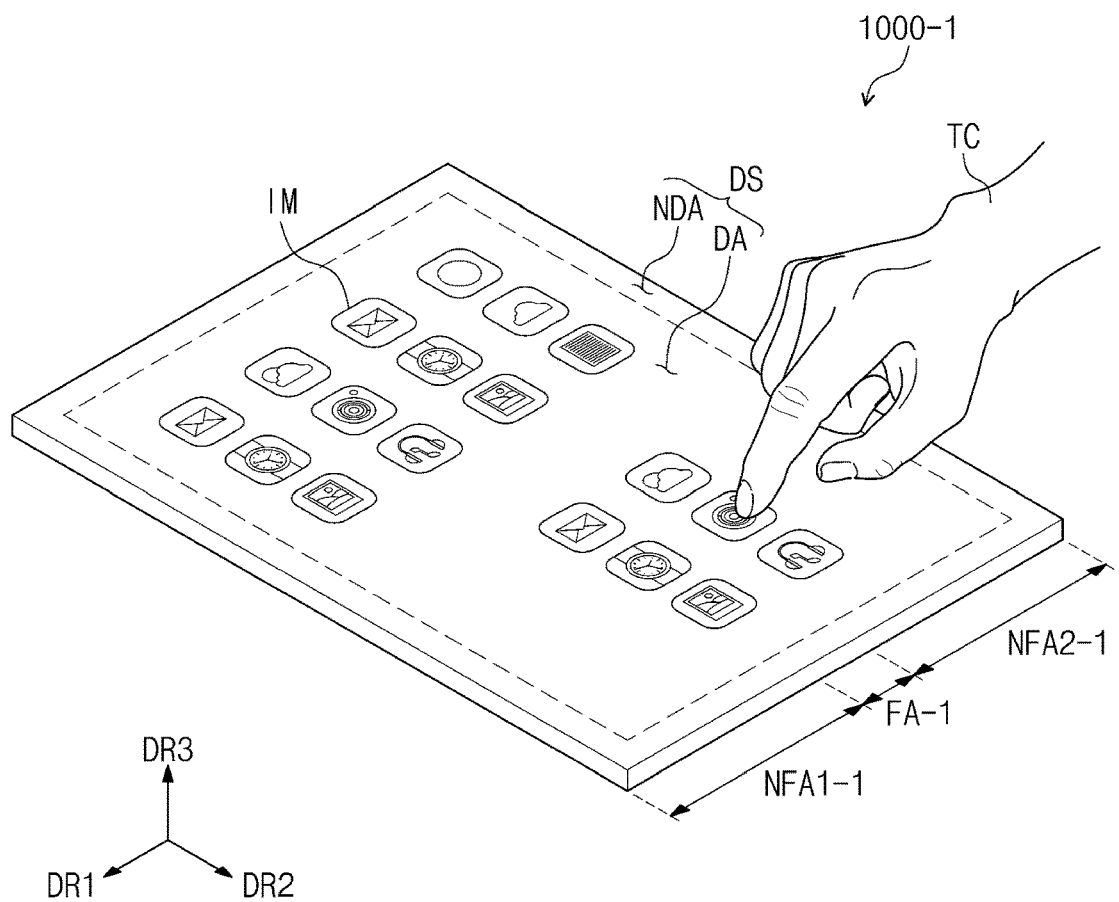
FIG. 2A is a perspective view illustrating a display device according to an example embodiment of the present disclosure.
Figure 2B:
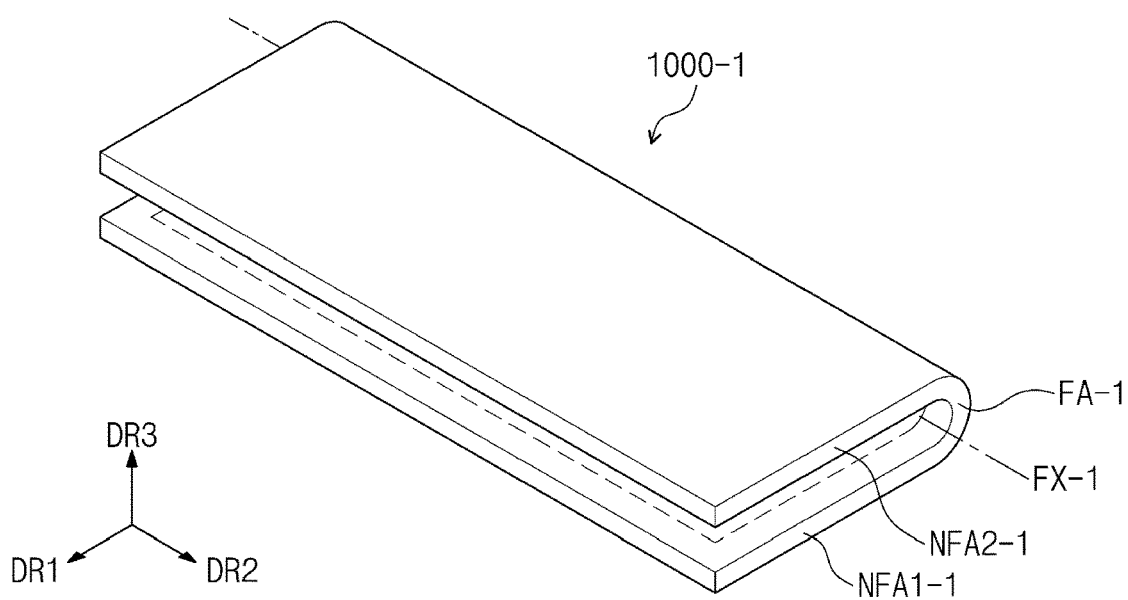
FIG. 2B is a perspective view illustrating a folded state of the display device of FIG. 2A.

FIG. 2A is a perspective view illustrating a display device according to an example embodiment of the present disclosure. FIG. 2B is a perspective view illustrating a folded state of the display device of FIG. 2A.

Referring to FIGS. 2A and 2B, a display device 1000-1 may include a first non-folding region NFA1-1, a folding region FA-1, and a second non-folding region NFA2-1, which are sequentially provided in the first direction DR1.

The folding region FA-1 may be provided between the first non-folding region NFA1-1 and the second non-folding region NFA2-1.

The display device 1000-1 may be folded along a folding axis FX-1. In other words, the folding region FA-1 may be bent along the folding axis FX-1. The folding axis FX-1 may be extended in the second direction DR2. The folding axis FX-1 may be parallel to a long axis that is parallel to the long side of the display device 1000-1.

Hereinafter, a structure of the display device 1000-1, which is folded along the short axis, will be described, but the present disclosure is not limited thereto. For example, various structures to be described below can be modified to realize the display device 1000-1 that is folded along the long axis, without departing from the spirit and scope of the present disclosure.

Figure 3A:
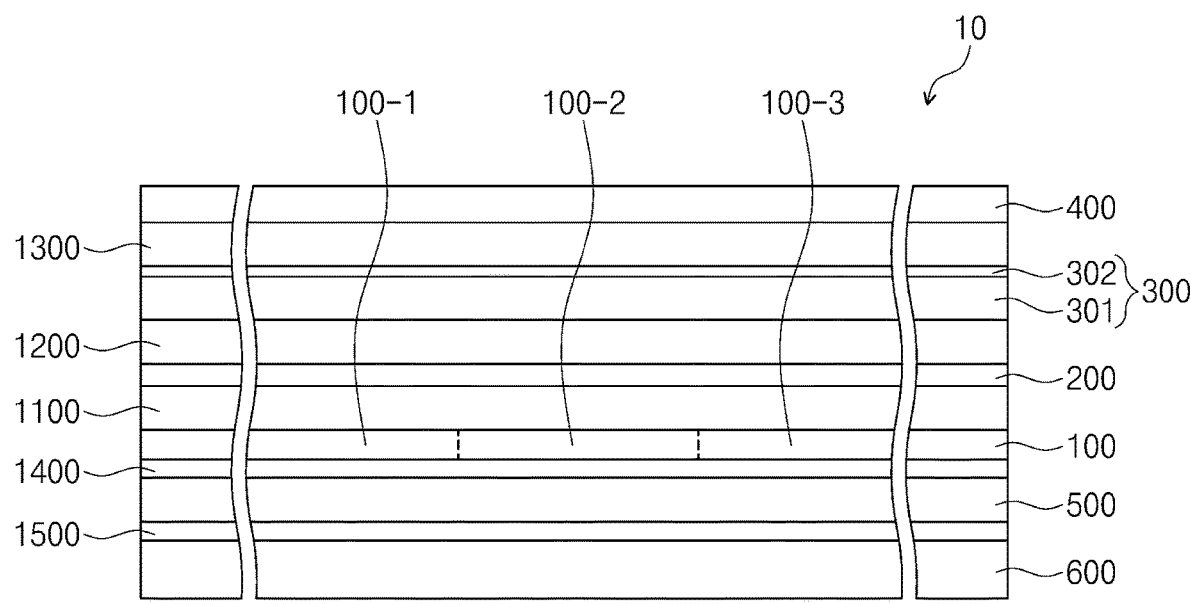
FIG. 3A is a cross-sectional view illustrating a display member according to an example embodiment of the present disclosure.
Figure 3A:
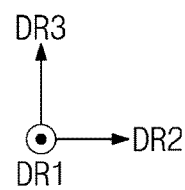

FIG. 3A is a cross-sectional view illustrating a display member according to an example embodiment of the present disclosure.

Referring to FIG. 3A, a display member 10 may include a display module 100, an anti-reflection layer 200, a window 300, an upper protection film 400, a lower protection film 500, and a cushion layer 600.

The display module 100 may display an image 1M (e.g., see FIG. 1A) and may sense an external input TC (e.g., see FIG. 1A). The external input TC may be a user's input. For example, the user input may include various types of external inputs, such as a part of a user's body, light, heat, pressure, or an object (e.g., a pen or stylus). In the present embodiment, the external input TC may be input to the display surface DS through a user's hand, as shown in FIG. 1A as an example. However, this is just one example of the external input TC and, as described above, the external input TC may be provided in various forms. In addition, the display module 100 may sense the external input TC, which is applied through a side or rear surface of the display device 1000, depending on a structure of the display device 1000, but the present disclosure is not limited to this example or a specific embodiment.

The display module 100 may include a display panel, which is used to generate an image, and an input-sensing layer, which is used to obtain information on coordinates of an external input.

The display panel may be a light-emitting type display panel, but the present disclosure is not limited thereto. For example, the display panel may be an organic light emitting display panel or a quantum dot light emitting display panel. For example, a light emitting layer of the organic light emitting display panel may be formed of an organic luminescent material. For example, a light emitting layer of the quantum dot light-emitting display panel may be formed of quantum dots and quantum rods.

The input-sensing layer may be disposed on the display panel. For example, the input-sensing layer be directly disposed on the display panel. For example, the input-sensing layer may be directly formed on the display panel through a successive process. The input-sensing layer may include a plurality of insulating layers and a plurality of conductive layers. The conductive layers may constitute a sensing electrode, which is used to sense an external input, a sensing line, which is connected to the sensing electrode, and a sensing pad, which is connected to the sensing line. The input-sensing layer may sense an, external input in, for example, a mutual-capacitance manner and/or in a self-capacitance manner. However, the method of sensing the external input is not limited to these examples.

A first region 100-1, a second region 100-2, and a third region 100-3 may be provided in the display module 100. The first region 100-1 may correspond to the first non-folding region NFA1 of FIG. 1A, the second region 100-2 may correspond to the folding region FA of FIG. 1A, and the third region 100-3 may correspond to the second non-folding region NFA2 of FIG. 1. In an example embodiment of the present disclosure, the first region 100-1 and the third region 100-3 may be non-folding regions, and the second region 100-2 may be a folding region.

The anti-reflection layer 200 may be disposed on the display module 100. The anti-reflection layer 200 may reduce reflectance of an external light, which is incident from the outside. For example, the anti-reflection layer 200 may include a phase retarder and a polarizer. The phase retarder may be of a film type or a liquid crystal coating type and may include a λ/2 and/or λ/4 phase retarder. The polarizer may also be of a film type or a liquid crystal coating type. The polarizer of the film type may include an elongated synthetic resin film, whereas the polarizer of the liquid crystal coating type may include liquid crystals arranged with a specific orientation. For example, the phase retarder and/or the polarizer may further include a protection film.

In an example embodiment of the present disclosure, the anti-reflection layer 200 may include color filters. The color filters may be arranged in a predetermined manner. The arrangement of the color filters may be determined in consideration of colors of lights to be emitted from pixels in the display panel. The anti-reflection layer 200 may further include a black matrix adjacent to the color filters.

In an example embodiment of the present disclosure, the anti-reflection layer 200 may include a destructive interference structure. For example, the destructive interference structure may include a first reflection layer and a second reflection layer, which are disposed on different layers. The first reflection layer and the second reflection layer may be configured to allow a first reflection light and a second reflection light, which are respectively reflected by the first and second reflection layers, to destructively interfere with each other, and this may make it possible to reduce reflectance of the external light.

An adhesion layer 1100 may be disposed between the display module 100 and the anti-reflection layer 200. The display module 100 and the anti-reflection layer 200 may be coupled to each other by the adhesion layer 1100. In an example embodiment of the present disclosure, the adhesion layer 1100 may be omitted. In an example embodiment of the present disclosure, the adhesion layer may be a typical adhesive material or a gluing agent. For example, each of the adhesion layers may be one of pressure sensitive adhesive (PSA), optical clear adhesive (OCA), or optical clear resin (OCR).

The window 300 may be disposed on the anti-reflection layer 200. The window 300 may include a base layer 301 and a functional coating layer 302. For example, the base layer 301 may include a glass substrate and/or a synthetic resin film. The base layer 301 may include, for example, a polyimide film. For example, the base layer 301 may not be limited to a single-layered structure. As an additional example, the base layer 301 may include two or more films that are coupled to each other by an adhesion member. The functional coating layer 302 may include at least one of an anti-fingerprint layer, an anti-reflection layer, or a hard coating layer.

An adhesion layer 1200 may be disposed between the window 300 and the anti-reflection layer 200, but in an example embodiment of the present disclosure, the adhesion layer 1200 may be omitted.

The upper protection film 400 may be disposed on the window 300. Due to the presence of the upper protection film 400, the display device 1000 may have an increased impact-resistant property. For example, the upper protection film 400 may be a polymer film or a tempered glass film. An adhesion layer 1300 may be disposed between the upper protection film 400 and the window 300, and in an example embodiment of the present disclosure, the adhesion layer 1300 may be omitted. In an example embodiment of the present disclosure, the upper protection film 400 may be omitted.

The lower protection film 500 may be disposed below the display module 100. The lower protection film 500 may be a layer protecting the rear surface of the display module 100. For example, the lower protection film 500 may include a synthetic resin film (e.g., a polyimide film or a polyethyleneterephthalate film). However, this is just one example, and the lower protection film 500 is not limited to this example. An adhesion layer 1400 may be disposed between the lower protection filler 500 and the display module 100.

The cushion layer 600 may be disposed below the lower protection film 500. For example, the cushion layer 600 may include a sponge, a foam, or an urethane resin. An adhesion layer 1500 may be disposed between the lower protection film 500 and the cushion layer 600.

Figure 3B:
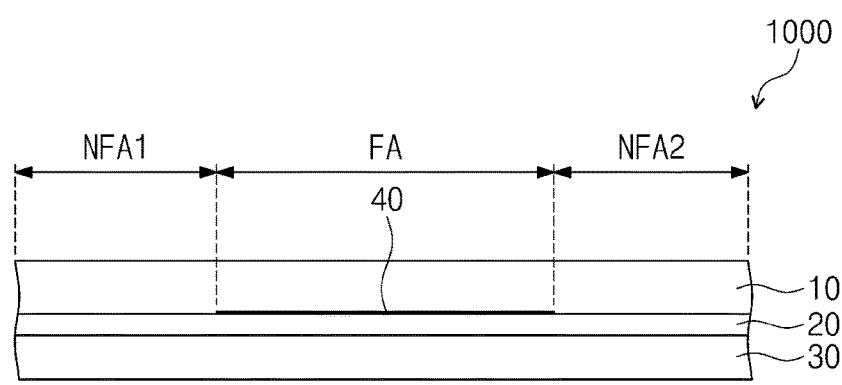
FIG. 3B is a cross-sectional view illustrating a display device according to an example embodiment of the present disclosure.

FIG. 3B is a cross-sectional view illustrating a display device according to an example embodiment of the present disclosure. FIG. 3B schematically illustrates a cross-section of a display device according to an example embodiment of the present disclosure.

Referring to FIG. 3B, the display device 1000 may include the display member 10, an adhesion member (e.g., an adhesion layer) 20, a supporting member (e.g., a supporting layer) 30, and a compensation member (e.g., a compensation layer) 40.

The display device 1000 may include the first non-folding region NFA1, the second non-folding region NFA2, and the folding region FA.

The display member 10 may have substantially the same features as those of FIG. 3A, and thus, a detailed description thereof will be omitted.

The supporting member 30 may be disposed on the display member 10 and may support the display member 10. The supporting member 30 may support the display module. The supporting member 30 may be disposed below the cushion layer 600 of the display member 10. For example, the supporting member 30 may be a metal plate. For example, the supporting member 30 may be include stainless steel, aluminum, or alloy thereof. The strength of the supporting member 30 may be greater than the strength of the display module 100. The thickness of the supporting member 30 may range from about 0.12 mm to about 0.2 mm.

The adhesion member 20 may be disposed between the display member 10 and the supporting member 30. The adhesion member 20 may include, for example, a double-sided tape. In an example embodiment of the present disclosure, the adhesion member 20 may include various adhesive agents (e.g., a pressure sensitive adhesive (PSA) or an optically clear adhesive (OCA)) adhering the display member 10 to the supporting member 30, in addition to the double-sided tape. The thickness of the adhesion member 20 may be less than or equal to about 0.1 mm.

In an example embodiment of the present disclosure, the compensation member 40 may be disposed between the display member 10 and the adhesion member 20. The compensation member 40 may be overlapped with the folding region FA. The compensation member 40 may be deposited on the top surface of the adhesion member 20. In an example embodiment of the present disclosure, unlike the structure illustrated in FIG. 3B, the display device 1000 may include the compensation member 40 disposed between the adhesion member 20 and the supporting member 30. For example, the compensation member 40 may be attached to the bottom surface of the adhesion member 20 to be disposed in the folding region FA and on the adhesion member 20. The compensation member 40 may be deposited on the adhesion member 20 or may be provided as a thin film attached to the adhesion member 20. This will be described in more detail with reference to FIGS. 6A to 7B.

In an example embodiment of the present disclosure, the compensation member 40 may be overlapped with the folding region FA and may not be overlapped with the first and second non-folding regions NFA1 and NFA2. For example, the compensation member 40 on the adhesion member 20 may be locally disposed on only the folding region FA.

The thickness of the compensation member 40 may be smaller than the thickness of the adhesion member 20. In an example embodiment of the present disclosure, the thickness of the compensation member 40 may range from about 3 to about 5 μm. The compensation member 40 may be, for example, a metal layer. In an example embodiment of the present disclosure, the compensation member 40 may be an aluminum layer, a silver layer, a stainless steel layer, or a layer that is made of at least one of the alloys thereof.

Figure 4A:
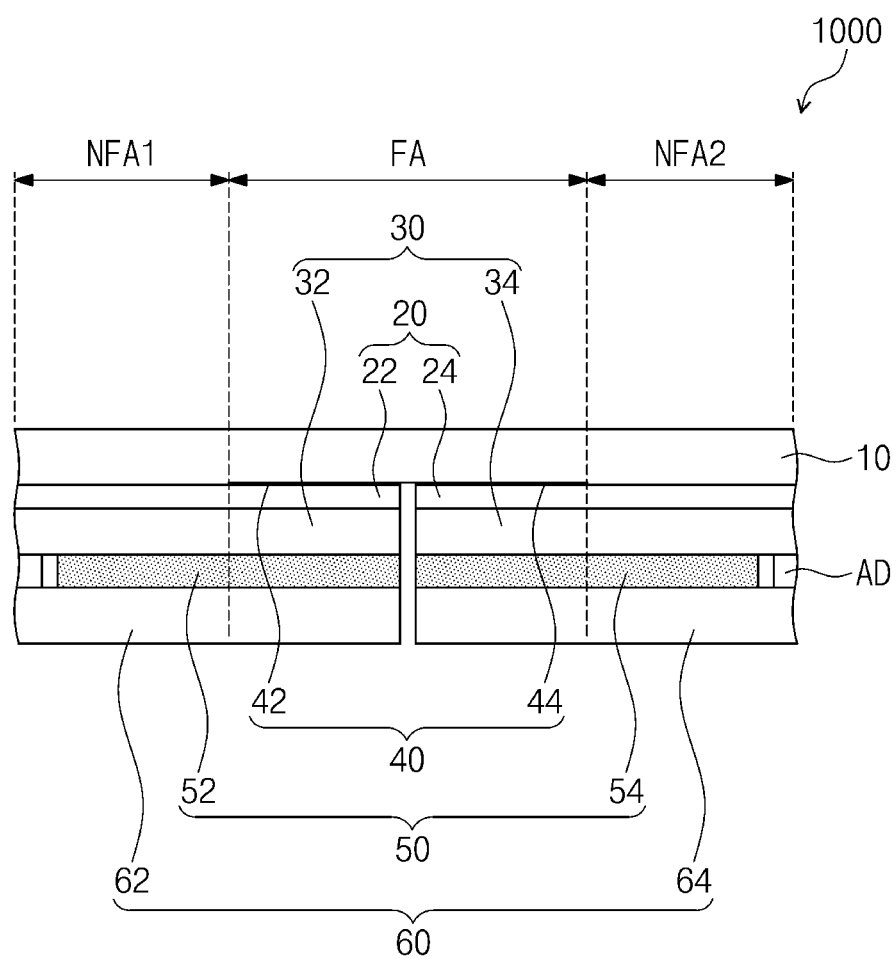
FIGS. 4A and 4B are cross-sectional views illustrating a display device according to an example embodiment of the present disclosure.
Figure 4B:
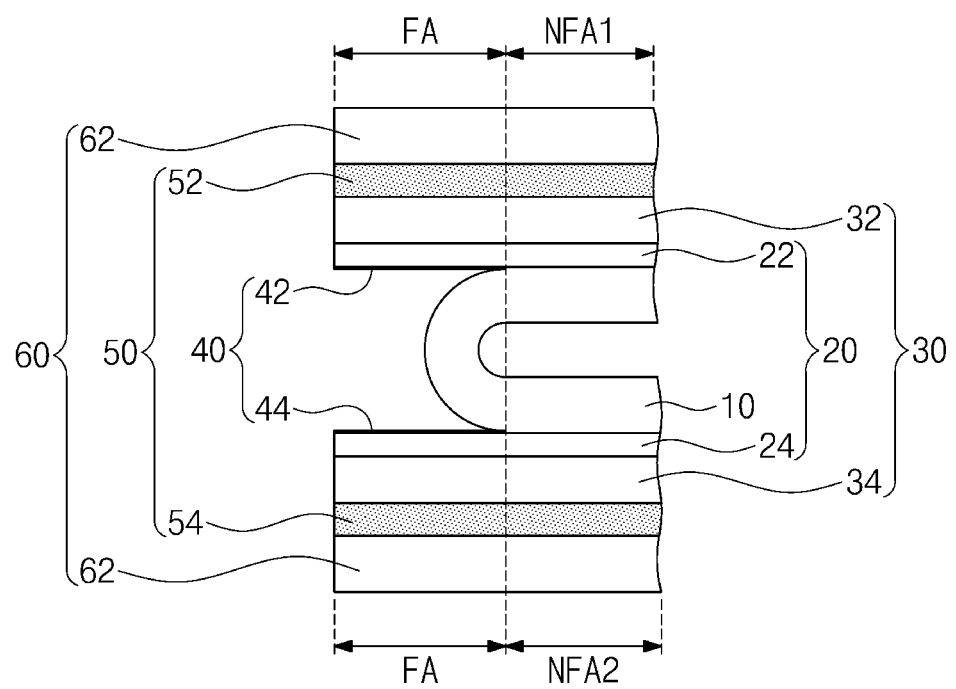

FIGS. 4A and 4B are cross-sectional views illustrating a display device according to an example embodiment of the present disclosure.

FIG. 4A is a cross-sectional view illustrating an unfolded (i.e., flat) state of the display device 1000. FIG. 4B is a cross-sectional view illustrating a folded state of the display device 1000.

Referring to FIG. 4A, the supporting member 30 may include a first supporting member (e.g., a first supporting layer) 32 and a second supporting member (e.g., a second supporting layer) 34. The first and second supporting members 32 and 34 may be spaced apart from each other. The first and second supporting members 32 and 34 may be spaced apart from each other in the folding region FA, and, when the display member 10 is in a bent state, the first and second supporting members 32 and 34 may not be bent since they are spaced apart from each other in the folding region FA.

The adhesion member 20 may include a first adhesion member (e.g., a first adhesion layer) 22 and a second adhesion member (e.g., a second adhesion layer) 24. The first adhesion member 22 may be attached to the first supporting member 32. For example, the first adhesion member 22 may be attached to a top surface of the first supporting member 32. The first adhesion member 22 may be overlapped with the first supporting member 32. The second adhesion member 24 may be attached to the second supporting member 34. For example, the second adhesion member 24 may be attached to a top surface of the second supporting member 34. The second adhesion member 24 may be overlapped with the second supporting member 34. The first and second adhesion members 22 and 24 may be spaced apart from each other. For example, the first and second adhesion members 22 and 24 may be disposed in the folding region FA and may be overlapped with the first and second supporting members 32 and 34, respectively, in the folding region FA. As an additional example, the first and second adhesion members 22 and 24 may be spaced apart from each other in the folding region FA. The first adhesion member 22 may be adhered to the bottom surface of the display member 10 in the first non-folding region NFA1, and the second adhesion member 24 may be adhered to the bottom surface of the display member 10 in the second non-folding region NFA2.

The compensation member 40 may include a first compensation member (e.g., a first compensation layer) 42 and a second compensation member (e.g., a second compensation layer) 44. The first compensation member 42 may be attached to the first adhesion member 22 in the folding region FA, and the second compensation member 44 may be attached to the second adhesion member 24 in the folding region FA. For example, the first compensation member 42 and the second compensation member 44 may be attached to the top surface of the first adhesion member 22 and the top surface of the second adhesion member 24, respectively. The first and second compensation members 42 and 44 may not be in contact with or may not be attached to the bottom surface of the display member 10. For example, the first and second compensation members 42 and 44 may be metal layers that are formed of the same material. The thicknesses of the first and second compensation members 42 and 44 may be the same as each other, and may be smaller than the thicknesses of the first and second adhesion members 22 and 24. In addition, the thicknesses of the first and second compensation members 42 and 44 may increase or decrease in proportion to the thicknesses of the first and second adhesion members 22 and 24. For example, in the case where the thicknesses of the first and second adhesion members 22 and 24 are about 0.1 mm, the thicknesses of the first and second compensation members 42 and 44 may range from about 3 μm to about 5 μm, and in the case where the thicknesses of the first and second adhesion members 22 and 24 are larger than about 0.1 mm, the thicknesses of the first and second compensation members 42 and 44 may be larger than about 5 μm.

In an example embodiment of the present disclosure, the width of the first compensation member 42 may be substantially equal to the width of the second compensation member 44. In the folding region FA, the width of the first adhesion member 22 may be substantially equal to the width of the first compensation member 42, and the width of the second adhesion member 24 may be substantially equal to the width of the second compensation member 44. In addition, in the folding region FA, the width of the first adhesion member 22 may be substantially equal to the width of the first supporting member 32, and the width of the second adhesion member 24 may be equal to the width of the second supporting member 34.

In an example embodiment of the present disclosure, the first compensation member 42 may be deposited on the top surface of the first adhesion member 22. The first compensation member 42, which may be a metal layer, may not be adhered to the display member 10 thereon and may be naturally separated from the display member 10 during a folding operation. However, the present disclosure is not limited thereto. For example, the first compensation member 42 may be adhered to a portion of the display member 10.

In a display device according to a comparative example, an adhesion member is used to adhere the supporting member 30 to the display member 10 in the first and second non-folding regions NFA1 and NFA2 but is not extended to the folding region FA. A height-difference compensation tape is disposed in the folding region FA and between the display member 10 and the supporting member 30 to compensate a height difference, and the height-difference compensation tape is spaced apart from the adhesion member in a horizontal direction to form a gap. Due to the presence of the gap, a bending portion may occur in the folding region of the display member, when the display device is changed from the folded state to the unfolded state. By contrast, according to an example embodiment of the present disclosure, the display device 1000 may include the first and second compensation members 42 and 44 of the compensation member 40, and the first and second adhesion members 22 and 24 of the adhesion member 20, which are extended to the folding region FA. In addition, the compensation member 40, which is disposed in the folding region FA and on the top surface of the adhesion member (e.g., 20 of FIGS. 4A and 4B), may be used instead of the height-difference compensation tape spaced apart from the adhesion member. Accordingly, it may be possible to reduce a stress in the folded state and to prevent or suppress a bending portion from occurring in the display member 10 when the display device 1000 is changed from the folded state to the unfolded state.

For example, in the case where the display device according to the comparative example was maintained in the folded state for about 24 hours and was unfolded, a bending portion having a thickness of about 40 μm was formed in three lines on the surface of the display member. By contrast, in the case where the display device 1000 according to an example embodiment of the present disclosure was maintained in the folded state for about 24 hours and then was unfolded, a bending portion having a thickness of about 19 μm to about 28 μm was formed in a single line.

Referring to FIG. 4A, the display device 1000 may further include a cushion member (e.g., a cushion layer) 50. The cushion member 50 may include a first cushion member (e.g., a first cushion layer) 52 and a second cushion member (e.g., a second cushion layer) 54. The cushion member 50, along with the supporting member 30, may support the display member 10. For example, the cushion member 50 may be disposed on the supporting member 30.

For example, the cushion member 50 may be disposed below the supporting member 30. The cushion member 50 may be a bar-shaped film or cushion. The first cushion member 52 may be disposed on the first supporting member 32, and the second cushion member 54 may be disposed on the second supporting member 34. For example, the first cushion member 52 may be disposed below the first supporting member 32, and the second cushion member 54 may be disposed below the second supporting member 34. The first cushion member 52 may support the folding region FA and at least a portion of the first non-folding region NFA1, and the second cushion member 54 may support the folding region FA and at least a portion of the second non-folding region NFA2. In an example embodiment of the present disclosure, the cushion member 50 may be overlapped with the folding region FA, at least a portion of the first non-folding region NFA1, and at least a portion of the second non-folding region NFA2. For example, the cushion member 50 may include a sponge, a foam, a urethane resin, or the like.

In an example embodiment of the present disclosure, the display device 1000 may further include a cover member 60. The cover member 60 may include a first cover member 62 and a second cover member 64. In an example embodiment of the present disclosure, the first cover member 62 may be disposed on the first supporting member 32, and the second cover member 64 may be disposed on the second supporting member 34. For example, the first cover member 62 may be disposed below the first supporting member 32, and the second cover member 64 may be disposed below the second supporting member 34. The first cover member 62 and the second cover member 64 may be spaced apart from each other. A distance between the first cover member 62 and the second cover member 64 may be substantially equal to a distance between the first and second supporting members 32 and 34. The cover member 60 may be coupled to the supporting member 30 by an adhesion layer AD. The first cover member 62 may be coupled to the first supporting member 32, and the second cover member 64 may be coupled to the second supporting member 34.

The display member 10 may have a flat or first state and a second state, in which the folding region FA is bent. An example of the flat or first state is illustrated in FIG. 4A.

Referring to FIG. 4B, the display member 10 may have a second state, in which the folding region FA is bent such that the first non-folding region NFA1 faces the second non-folding region NFA2.

In an example embodiment of the present disclosure, the first and second compensation members 42 and 44 may be opposite to each other, in the second state. The first and second compensation members 42 and 44 may be attached to the first and second adhesion members 22 and 24, respectively, in the display region and may not be in contact with the bottom surface of the display member 10 when the display member 10 is in the second state. In an example embodiment of the present disclosure, the first and second compensation members 42 and 44 may be overlapped with the folding region FA and may not be overlapped with the first and second non-folding regions NFA1 and NFA2.

In an example embodiment of the present disclosure, the first and second compensation members 42 and 44 may be in contact with a portion of the bottom surface of the display member 10, and may overlap the folding region FA and portions of the first and second non-folding regions NFA1 and NFA2.

Figure 5A:
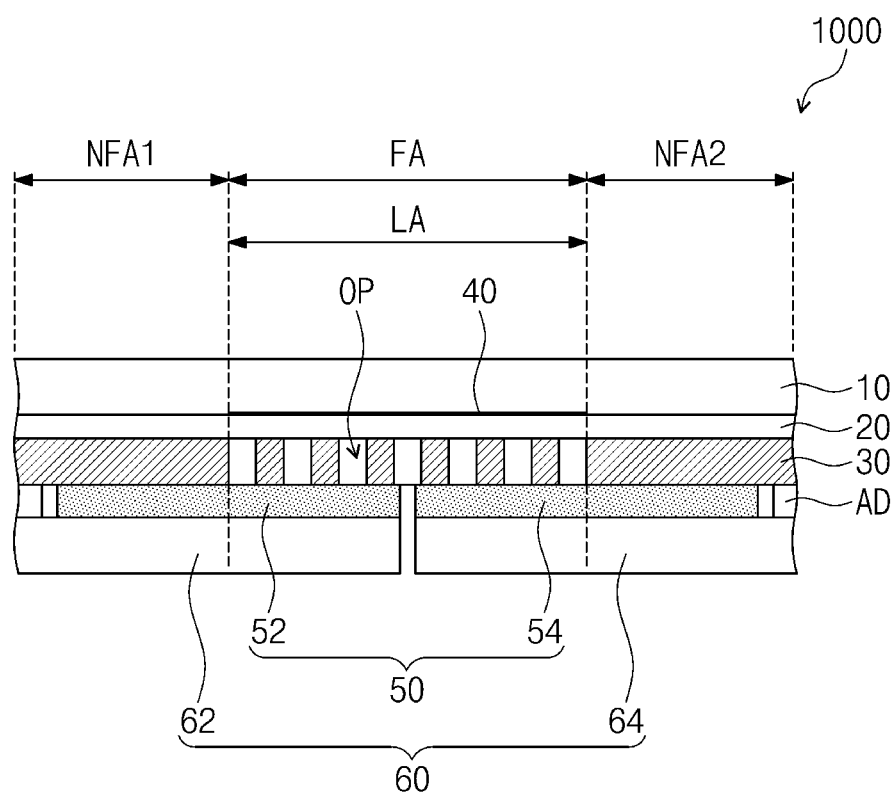
FIGS. 5A and 5B are cross-sectional views illustrating a display device according to an example embodiment of the present disclosure.
Figure 5B:
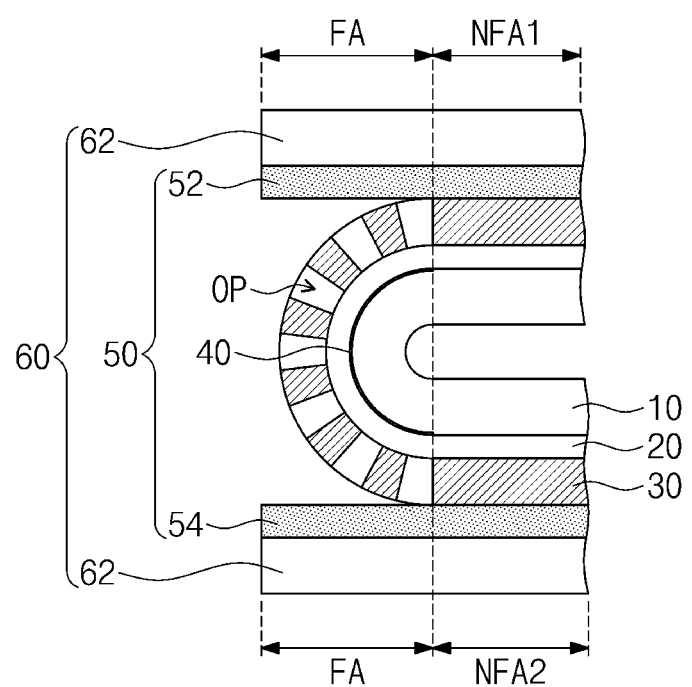

FIGS. 5A and 5B are cross-sectional views illustrating a display device according to an example embodiment of the present disclosure.

FIG. 5A is a cross-sectional view illustrating an unfolded (i.e., flat) state of the display device 1000 according to an example embodiment of the present disclosure. FIG. 5B is a cross-sectional view illustrating folded state of the display device 1000 according to an example embodiment of the present disclosure. For concise description, an element previously described with reference to FIGS. 4A and 4B may be identified by the same reference number without repeating an overlapping or repetitive description thereof.

Referring to FIG. 5A, the supporting member 30 may include a lattice region LA, which is overlapped with the folding region FA. The supporting member 30 may include a plurality of openings OP, in the lattice region LA. The openings OP may be spaced apart from each other by a predetermined distance to provide the lattice region LA. The openings OP may be provided in the lattice region LA, and thus, the lattice region LA may have relatively high flexibility. Accordingly, the display device 1000 may be easily folded, and a contamination material or external particles may be prevented from entering the display member 10.

Referring to FIG. 5B, the adhesion member 20 may be disposed on the lattice region LA of the supporting member 30, and the compensation member 40 may be disposed on the adhesion member 20 and may be overlapped with the lattice region LA. In other words, the compensation member 40 may be disposed between the display member 10 and the adhesion member 20. For example, the compensation member 40 may be a thin metal layer having a thickness of about 3 μm to about 5 μm and may have a flexible property which can be bent along with the supporting member 30, when the supporting member 30 is bent in the lattice region LA.

The compensation member 40 may prevent or suppress a bending portion from occurring when operations of bending and unbending of the supporting member 30 are repeated in the lattice region LA, and this may make it possible to prevent or suppress a bending portion from occurring in the folding region of the display member 10 by the bending and unbending of the supporting member 30.

Figure 6A:
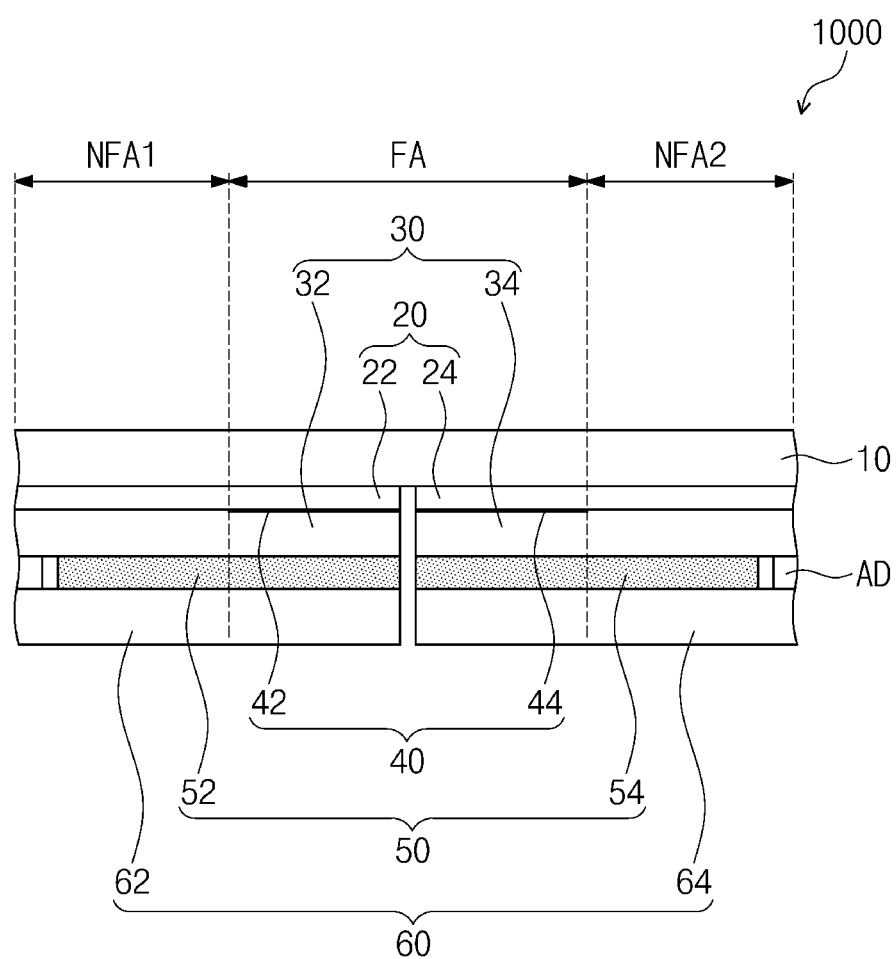
FIGS. 6A, 6B and 6C are cross-sectional views illustrating a display device according to an example embodiment of the present disclosure.
Figure 6B:
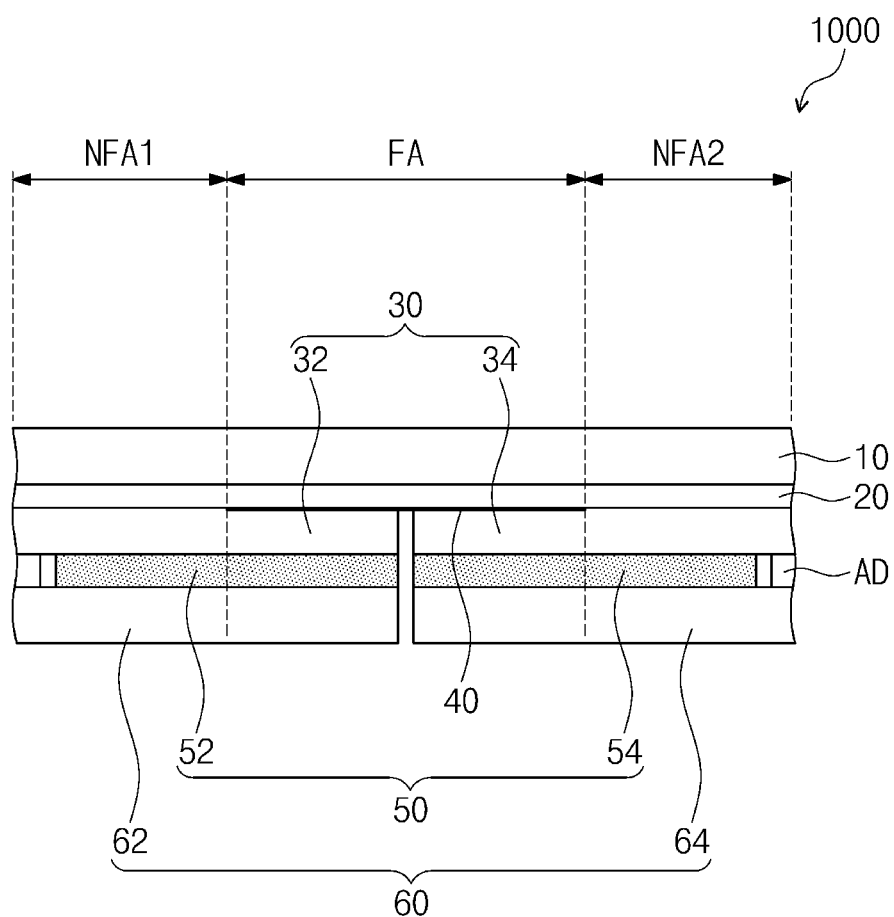
Figure 6C:
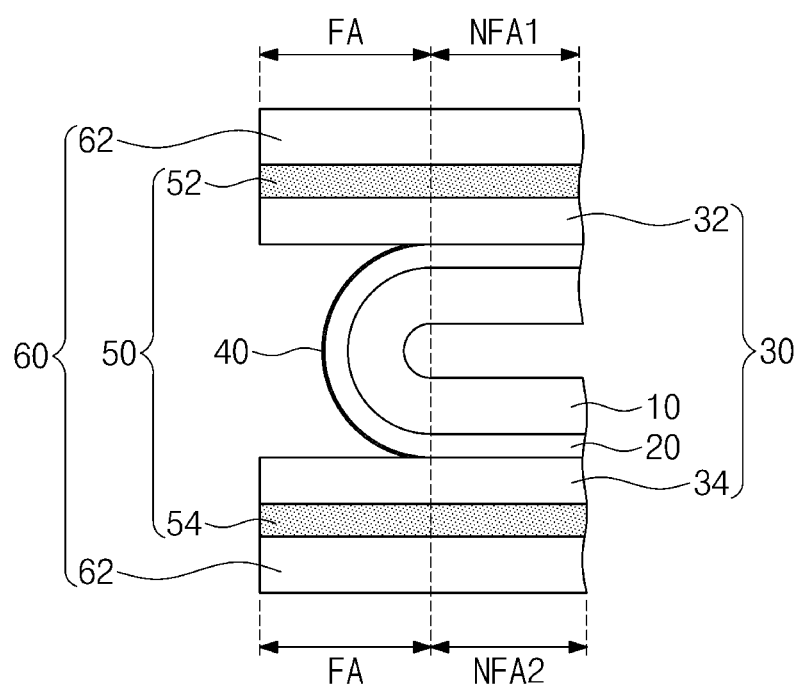

FIGS. 6A to 6C are cross-sectional views illustrating a display device according to an example embodiment of the present disclosure.

FIGS. 6A and 6B are sectional views, each of which illustrates a flat state of the display device 1000 according to an example embodiment of the present disclosure. FIG. 6C is a cross-sectional view illustrating a folded state of the display device 1000 of FIG. 6B. For concise description, an element previously described with reference to FIGS. 4A and 4B may be identified by the same reference number without repeating an overlapping or repetitive description thereof.

Referring FIG. 6A, the first and second supporting members 32 and 34 may be spaced apart from each other. The first and second adhesion members 22 and 24 may be spaced apart from each other. In the folding region FA, the first and second adhesion members 22 and 24 may be spaced apart from each other and may be overlapped with the first and second supporting members 32 and 34, respectively. The first adhesion member 22 may be adhered to the top surface of the supporting member 30 in the first non-folding region NFA1, and the second adhesion member 24 may be adhered to the top surface of the supporting member 30 in the second non-folding region NFA2.

The first compensation member 42 may be attached to the bottom surface of the first adhesion member 22 in the folding region FA, and the second compensation member 44 may be attached to the bottom surface of the second adhesion member 24 in the folding region FA. When the display member 10 is in the flat or first state, the first and second compensation members 42 and 44 may be in contact with top surfaces of the first and second supporting members 32 and 34, respectively, but may not be attached to the top surfaces of the first and second supporting members 32 and 34.

Referring to FIGS. 6B and 6C, the compensation member 40 may be disposed between the adhesion member 20 and the first and second supporting members 32 and 34. The compensation member 40 may be overlapped with the folding region FA and may not be overlapped with the first and second non-folding regions NFA1 and NFA2. For example, the compensation member 40 may be a bar-shaped structure having the same width as the folding region FA.

In an example embodiment of the present disclosure, the compensation member 40 may be attached to the bottom surface of the adhesion member 20 through deposition or the like and may be in contact with the top surfaces of the first and second supporting members 32 and 34, when the display member 10 is in the flat or first state, but the compensation member 40 may not be attached to the top surfaces of the first and second supporting members 32 and 34. When the display member 10 is in a bent or second state, the compensation member 40, which is attached to the bottom surface of the adhesion member 20, may be bent along with the display member 10 and may not be in contact with the first and second supporting members 32 and 34.

Figure 7A:
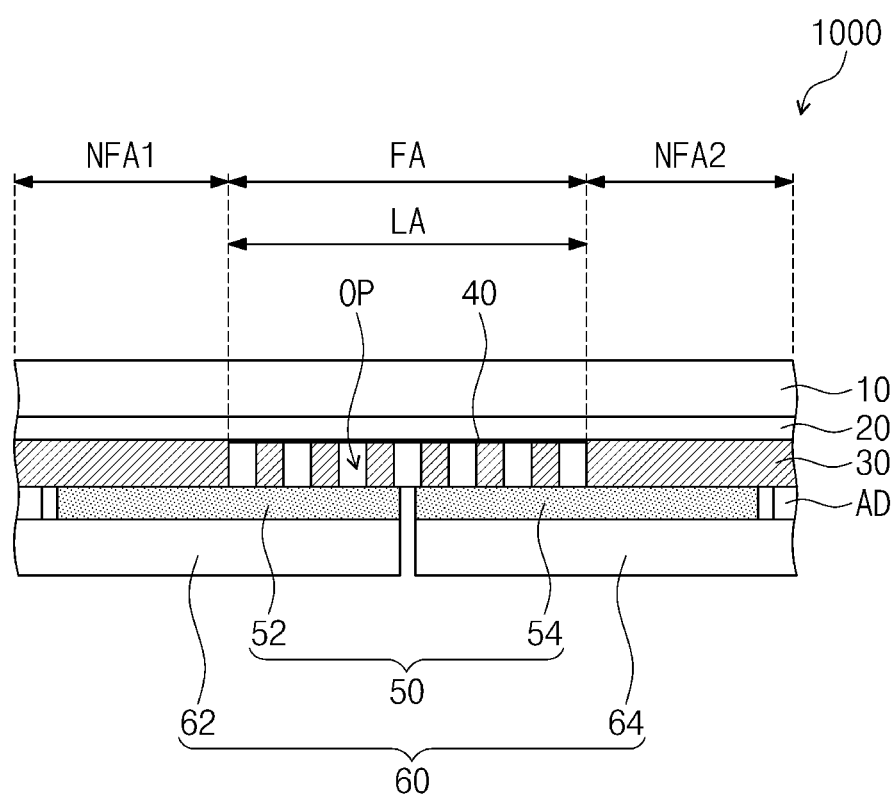
FIGS. 7A and 7B are cross-sectional views illustrating a display device according to an example embodiment of the present disclosure.
Figure 7B:
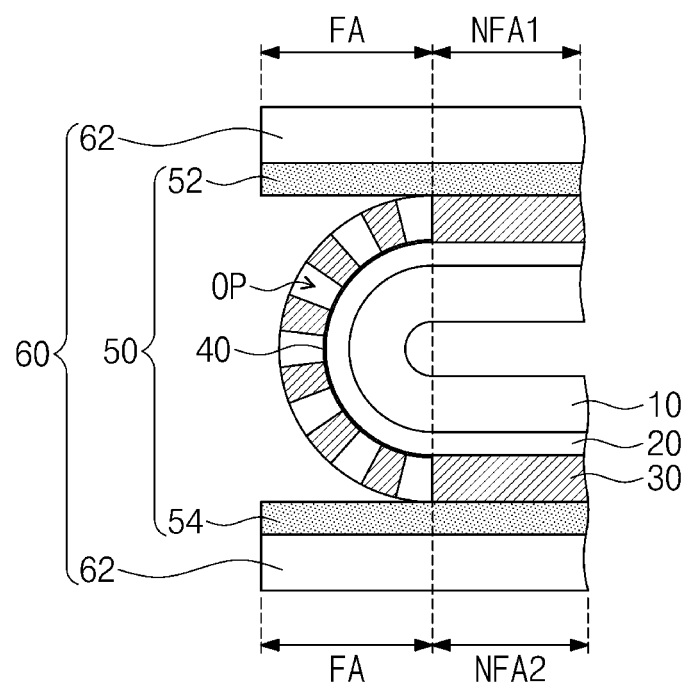

FIGS. 7A and 7B are cross-sectional views illustrating a display device according to an example embodiment of the present disclosure.

FIG. 7A is a cross-sectional view illustrating an unfolded (i.e., flat) state of the display device 1000 according to an example embodiment of the present disclosure. FIG. 7B is a cross-sectional view illustrating a folded state of the display device 1000 according to an example embodiment of the present disclosure. For concise description, an element previously described with reference to FIGS. 4A to 5B may be identified by the same reference number without repeating an overlapping or repetitive description thereof.

Referring to FIGS. 7A and 7B, the adhesion member 20 may be disposed on the supporting member 30, and the compensation member 40 may be disposed below the adhesion member 20 to be overlapped with the lattice region LA. In other words, the compensation member 40 may be disposed between the adhesion member 20 and the supporting member 30. The compensation member 40 may be, for example, a thin metal layer overlapped with the folding region FA and may be bent, along with the lattice region LA.

Figure 8:
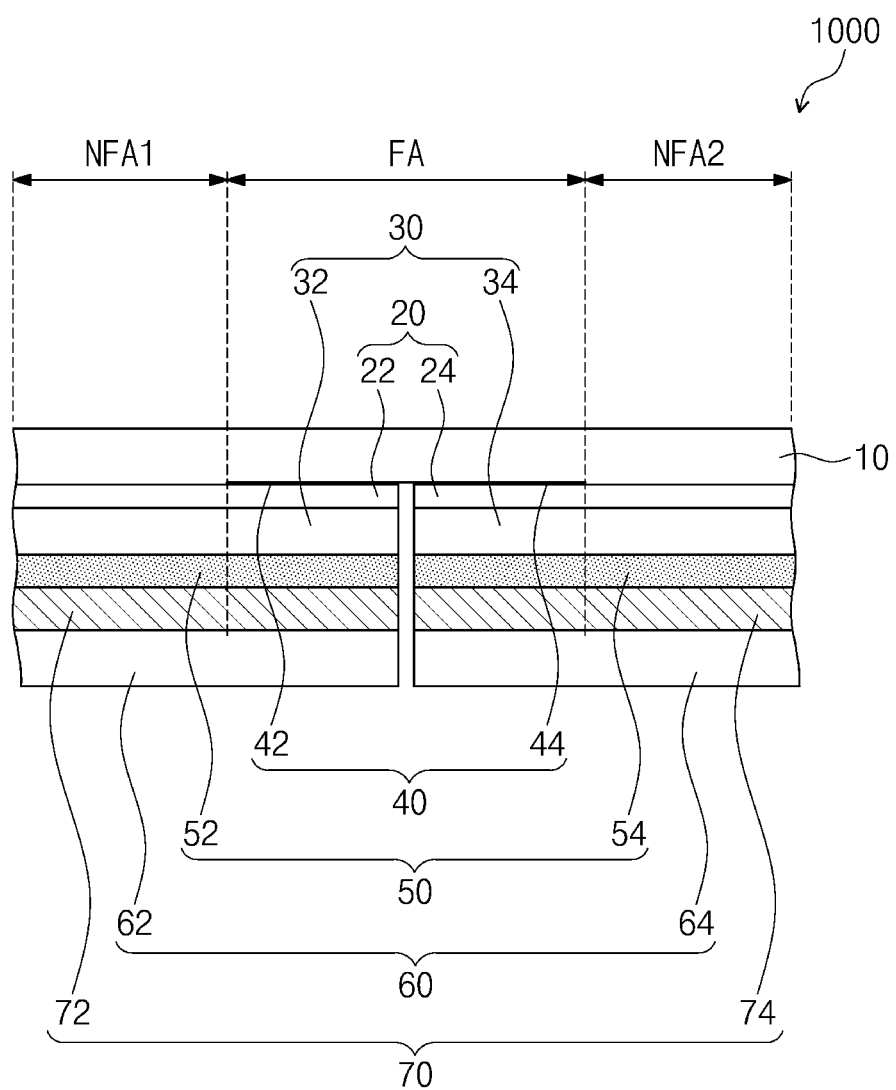
FIG. 8 is a cross-sectional view illustrating a display device according to an example embodiment of the present disclosure.
Figure 9:
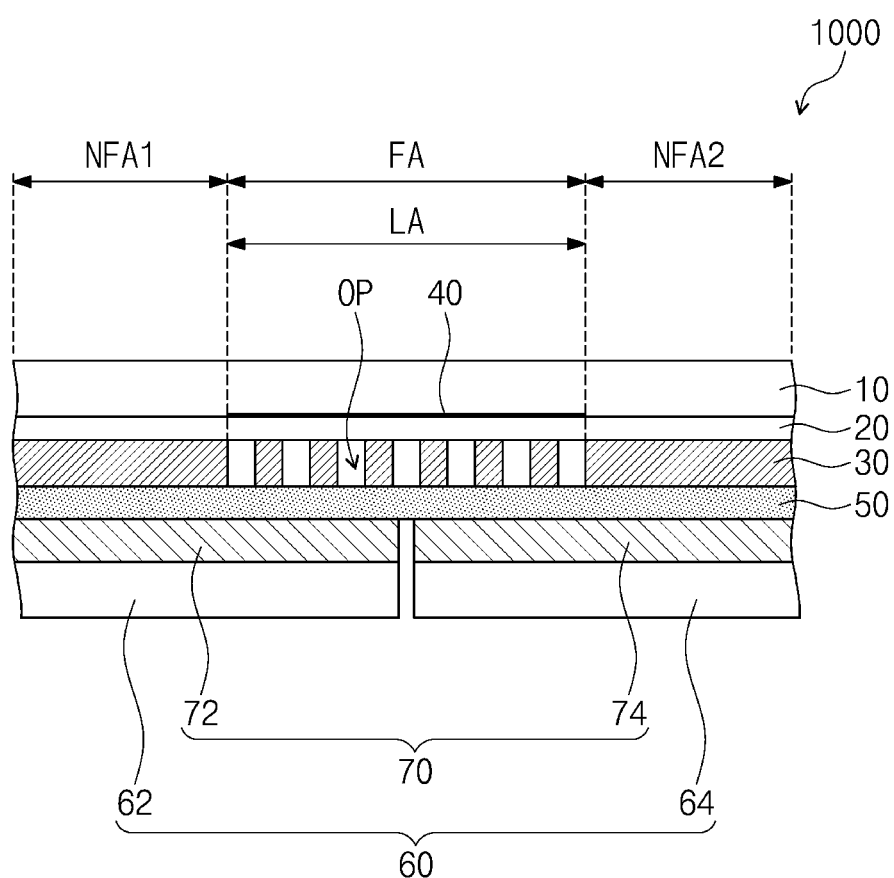
FIG. 9 is a cross-sectional view illustrating a display device according to an example embodiment of the present disclosure.

FIGS. 8 and 9 are cross-sectional views illustrating a display device according to an example embodiment of the present disclosure. For concise description, an element previously described with reference to FIGS. 4A to 5B may be identified by the same reference number without repeating an overlapping, or repetitive description thereof.

Referring to FIGS. 8 and 9, the display device 1000 may further include a supporting plate 70, which is disposed below the cushion member 50. The supporting plate 70 may include a first supporting plate 72 and a second supporting plate 74. The first supporting plate 72 and the second supporting plate 74 may be spaced apart from each other in the folding region FA. Referring to FIG. 8, the first and second supporting plates 72 and 74 may be respectively disposed below the first and second cushion members 52 and 54, which are spaced apart from each other, to support the first and second supporting members 32 and 34, respectively, which are spaced apart from each other. Referring to FIG. 9, the first and second supporting plates 72 and 74 ma be disposed below the bar-shaped cushion member 50 to support the bar-shaped supporting member 30 including the lattice region LA. Further, the cushion member 50 does not include a space in the folding region FA, The first and second supporting plates 72 and 74, in conjunction with the supporting member 30, may prevent the folding region FA from being pressed and consequently deformed, when the display member 10 is in the unfolded state. The supporting plate 70 may be disposed between the cushion member 50 and the cover member 60. For example, the supporting plate 70 may include stainless steel, aluminum, or alloys thereof.

According to an example embodiment of the present disclosure, an adhesion layer may be extended to a display region, and a relatively thin compensation member may be disposed between the display module and the adhesion layer, instead of a height-difference compensation tape that is disposed in the display region and on an adhesion layer between a display module and a metal plate. Accordingly, it may be possible to reduce a stress in a display device in a folded state and to prevent or suppress a bending or a deformed portion from occurring in the display device in an unfolded state.

While the present disclosure has been described with reference to example embodiments thereof, it will be understood by those of ordinary skill in the art that various changes in form and details may be made thereto without departing from the spirit and scope of the present disclosure

What is claimed is:

1. A display device comprising:
a display member including a display module and a first non-folding region, a second non-folding region, and a folding region defined in the display module;
a supporting layer disposed on the display member;
an adhesion layer disposed between the display member and the supporting layer;
a compensation layer attached to the adhesion layer and overlapped with the folding region;
a cushion layer disposed below the supporting layer; and
a supporting plate disposed below the cushion layer.

2. The display device of claim 1, wherein the supporting layer comprises a first supporting layer and a second supporting layer spaced apart from the first supporting layer in the folding region,
wherein the adhesion layer comprises a first adhesion layer and a second adhesion layer, wherein the first adhesion layer is adhered to the first supporting layer, and the second adhesion layer is adhered to the second supporting layer, and
wherein the compensation layer comprises a first compensation layer and a second compensation layer, wherein the first compensation layer is attached to the first adhesion layer, and the second compensation layer is attached to the second adhesion layer.

3. The display device of claim 2, wherein the first compensation layer and the second compensation layer have a same width as each other, and
wherein, in the folding region, the width of the first compensation layer and the width of the second compensation layer are substantially equal to a width of the first adhesion layer and a width of the second adhesion layer, respectively.

4. The display device of claim 2,
wherein the cushion layer comprises a first cushion layer and a second cushion layer, wherein the first cushion layer overlaps the first supporting layer, and the second cushion layer overlaps the second supporting layer.

5. The display device of claim 2, wherein the display member has a first state and a second state, wherein, in the first state, the display member is configured to be flat, and in the second state, the folding region is bent such that the first non-folding region faces the second non-folding region.

6. The display device of claim 5, wherein, in the first state, the compensation layer is in contact with a bottom surface of the display member in the folding region.

7. The display device of claim 5, wherein, in the second state, the first compensation layer and the second compensation layer face each other and are not in contact with at least a portion of a bottom surface of the display member.

8. The display device of claim 1, wherein the compensation layer is not overlapped with the first non-folding region and the second non-folding region.

9. The display device of claim 1, wherein a thickness of the compensation layer is smaller than a thickness of the adhesion layer.

10. The display device of claim 1, wherein a thickness of the compensation layer ranges from about 3 µm to about 5 µm.

11. The display device of claim 1, wherein the compensation layer includes a metal layer.

12. The display device of claim 11, wherein the metal layer includes an aluminum and/or silver layer.

13. The display device of claim 1, wherein the supporting layer comprises a lattice region including a plurality of openings formed therein, and
wherein the lattice region is overlapped with the folding region.

14. The display device of claim 12,
wherein the supporting plate includes a first supporting plate and a second supporting plate spaced apart from each other in the folding region.

15. The display device of claim 1, wherein the compensation layer is attached to a bottom surface of the adhesion layer, and
wherein the supporting layer comprises a first supporting layer and a second supporting layer spaced apart from each other in the folding region.

16. The display device of claim 15, wherein the adhesion layer comprises a first adhesion layer and a second adhesion layer, wherein the first adhesion layer is adhered to the first supporting layer, and the second adhesion layer is adhered to the second supporting layer, and
wherein the compensation layer comprises a first compensation layer and a second compensation layer, wherein the first compensation layer is attached to the first adhesion layer, and the second compensation layer is attached to the second adhesion layer.

17. The display device of claim 15, wherein the display member has a first state and a second state, wherein, in the first state, the display member is configured to be flat, and in the second state, the folding region is bent such that the first non-folding region faces the second non-folding region.

18. The display device of claim 17, wherein, in the first state, the compensation layer is in contact with a top surface of the supporting layer in the folding region.

19. The display device of claim 17, wherein, in the second state, the compensation layer is bent along with the display member and is not in contact with at least a portion of a top surface of the supporting layer.

20. A display device, comprising:
a display member including a first non-folding region, a second non-folding region, a folding region and a display module, wherein the display member has a first state and a second state, wherein, in the first state, the display member is configured to be flat, and in the second state, the folding region is bent;
a supporting layer comprising a first supporting layer and a second supporting layer spaced apart from each other in a region corresponding to the folding region;
an adhesion layer including a first adhesion layer and a second adhesion layer, wherein the first adhesion layer is disposed between the display member and the first supporting layer, and the second adhesion layer is disposed between the display member and the second supporting layer; and
a compensation layer including a first compensation layer and a second compensation layer, wherein the first compensation layer is attached to the first adhesion layer, and the second compensation layer is attached to the second adhesion layer, wherein the first compensation layer is disposed between the first adhesion layer and the first supporting layer, and the second compensation layer is disposed between the second adhesion layer and the second supporting layer,
wherein each of the first and second compensation layers is overlapped with the folding region and is not overlapped with the first and second non-folding regions, and wherein, in the second state, the first compensation layer and the second compensation layer are not in contact with a top surface of the display member and face each other.

* * * * *